United States Patent
Inagaki et al.

(10) Patent No.: US 12,051,188 B2
(45) Date of Patent: Jul. 30, 2024

(54) SUBSTRATE WORK SYSTEM

(71) Applicant: FUJI CORPORATION, Chiryu (JP)

(72) Inventors: Mitsutaka Inagaki, Anjo (JP); Hidetoshi Kawai, Anjo (JP)

(73) Assignee: FUJI CORPORATION, Chiryu (JP)

(*) Notice: Subject to any disclaimer, the term of this patent is extended or adjusted under 35 U.S.C. 154(b) by 398 days.

(21) Appl. No.: 17/629,758

(22) PCT Filed: Jul. 26, 2019

(86) PCT No.: PCT/JP2019/029470
§ 371 (c)(1),
(2) Date: Jan. 24, 2022

(87) PCT Pub. No.: WO2021/019609
PCT Pub. Date: Feb. 4, 2021

(65) Prior Publication Data
US 2022/0261981 A1    Aug. 18, 2022

(51) Int. Cl.
*G06T 5/50*    (2006.01)
*G06T 7/00*    (2017.01)
*H05K 13/08*   (2006.01)

(52) U.S. Cl.
CPC ............ *G06T 7/0004* (2013.01); *G06T 5/50* (2013.01); *H05K 13/08* (2013.01);
(Continued)

(58) Field of Classification Search
CPC .... G01N 21/95684; G06T 2207/10024; G06T 2207/20212; G06T 2207/30108;
(Continued)

(56) References Cited

U.S. PATENT DOCUMENTS 5,850,279 A * 12/1998 Nara .................. G03F 7/70358
356/399
6,542,238 B1 * 4/2003 Tsuboi .............. H05K 13/0812
356/401
(Continued)

FOREIGN PATENT DOCUMENTS

DE    10 2013 104 679 A1    11/2014
JP    11-312898 A            11/1999
(Continued)

OTHER PUBLICATIONS

Pan Bing et al., "Review of single-camera stereo-digital image correlation techniques for full-field 3D shape and deformation measurement," Sep. 12, 2017, Science China Technological Sciences, Jan. 2018 vol. 61 No. 1: 2-20, pp. 1-16.*
(Continued)

*Primary Examiner* — Omar S Ismail
(74) *Attorney, Agent, or Firm* — Oblon, McClelland, Maier & Neustadt, L.L.P.

(57) ABSTRACT

A board work system includes a moving device configured to move over an XY-plane, a lighting device attached to the moving device, a monochromatic camera attached to the moving device, and an image processing device. The image processing device selects one or multiple monochromatic lights based on a target object and, when the image processing device selects one monochromatic light, the image processing device causes the lighting device and the monochromatic camera to capture a monochromatic image of the target object which is illuminated with the one monochromatic light and sets the monochromatic image of the target object as a target object inspection image. When the image processing device selects multiple monochromatic lights, the image processing device captures monochromatic images of the target object illuminated with the monochro-
(Continued)

matic lights and sets a composite image where the monochromatic images are combined as a target object inspection image.

7 Claims, 6 Drawing Sheets

(52) U.S. Cl.
CPC .............. *G06T 2207/10024* (2013.01); *G06T 2207/20212* (2013.01); *G06T 2207/30108* (2013.01)

(58) Field of Classification Search
CPC ......... G06T 5/50; G06T 7/0004; H05K 13/08; H05K 13/081
See application file for complete search history.

(56) References Cited

U.S. PATENT DOCUMENTS

| | | | | |
|---|---|---|---|---|
| 2004/0061850 | A1* | 4/2004 | Fisch | G01N 21/8806 356/237.2 |
| 2005/0064936 | A1* | 3/2005 | Pryor | A63F 7/027 463/36 |
| 2005/0205778 | A1* | 9/2005 | Kitai | B23K 26/364 250/309 |
| 2007/0149873 | A1* | 6/2007 | Say | A61B 5/1451 600/347 |
| 2008/0132332 | A1* | 6/2008 | Pryor | A63F 13/213 463/31 |
| 2013/0314526 | A1* | 11/2013 | Yasuda | G01N 33/487 348/79 |
| 2013/0324875 | A1* | 12/2013 | Mestha | A61B 5/1077 600/534 |
| 2014/0111618 | A1* | 4/2014 | Kumagai | G01B 11/14 348/46 |
| 2015/0320313 | A1* | 11/2015 | Stamile | A61B 3/12 351/246 |
| 2016/0202038 | A1* | 7/2016 | Kim | G01B 9/02041 348/135 |
| 2017/0289416 | A1* | 10/2017 | Umemura | G01B 11/002 |
| 2018/0144995 | A1* | 5/2018 | Kim | G01B 11/022 |
| 2018/0156606 | A1* | 6/2018 | Jeon | G06T 7/521 |
| 2019/0244343 | A1* | 8/2019 | Chuang | G06F 3/0484 |
| 2019/0335633 | A1* | 10/2019 | Jung | H05K 13/0815 |
| 2020/0045862 | A1* | 2/2020 | Jung | G01N 21/956 |
| 2020/0184629 | A1* | 6/2020 | Kim | G06T 7/0004 |
| 2022/0261981 | A1* | 8/2022 | Inagaki | G06T 7/0004 |
| 2023/0184535 | A1* | 6/2023 | Lee | G01B 9/02011 356/450 |

FOREIGN PATENT DOCUMENTS

| | | | | |
|---|---|---|---|---|
| JP | | 11312896 | A * | 11/1999 |
| JP | | 2002-271099 | A | 9/2002 |
| JP | | 2002271099 | A * | 9/2002 |
| JP | | 2004-191355 | A | 7/2004 |
| JP | | 2007-149873 | A | 6/2007 |
| JP | | 2017-181188 | A | 10/2017 |
| WO | WO-2021019609 | A1 * | 2/2021 | ....... G01N 21/95684 |

OTHER PUBLICATIONS

Xu Chen et al., "Cluster approach based multi-camera digital image correlation: Methodology and its application in large area high temperature measurement," Sep. 6, 2013,Optics & Laser Technology 57(2014), pp. 318-323.*
Ayan Chaki et al., "A Comprehensive Market Analysis on Camera and Illumination Sensors for Image Processing and Machine Vision Applications,"Feb. 17, 2011,2010 International Conference on Computational Intelligence and Communication Networks, pp. 382-383.*
Lexin Hou et al., "A review of RGB-LED based mixed-color illumination system for Machine vision and microscopy,"Sep. 27, 2016, Proceedings vol. 9684, 8th International Symposium on Advanced Optical Manufacturing and Testing Technologies: Optical Test, Measurement Technology, and Equipment; 968439 (2016) ht.*
Mohammed Benmoussat et al., "Surface Defect Detection of Metal Parts: Use of Multimodal Illuminations and Hyperspectral Imaging Algorithms,"Sep. 17, 2012,2012 IEEE International Conference on Imaging Systems and Techniques Proceedings, pp. 1-5.*
International Search Report mailed on Oct. 15, 2019 in PCT/JP2019/029470 filed on Jul. 26, 2019, 2 pages.

* cited by examiner

SUBSTRATE WORK SYSTEM

TECHNICAL FIELD

The present description discloses a board work system.

BACKGROUND ART

Conventionally, a board work system has been known which is configured to work on a board disposed on an XY-plane. For example, Patent Literature 1 discloses, as such a board work system, a known board work system which includes a head movable on an XY-plane, a lighting device for shining light on a board, and a camera for imaging the board on which light is being shined by the lighting device. On the other hand, as an image pick-up system, as described in Patent Literature 2, an image pick-up system is known which is configured to obtain a first optical image and a second optical image in order to generate a composite image. The composite image is a color image, and the first and second optical images are both made up of color components which make up the composite color image.

PATENT LITERATURE

Patent Literature 1: JP-A-2002-271099
Patent Literature 2: JP-A-2004-191355

BRIEF SUMMARY

Technical Problem

Incidentally, in the board work system, some target objects that are imaged by the camera can be recognized by black-and-white or monochromatic images, while others cannot be so recognized. In consideration of this point, it is also conceivable to obtain a color image of a target object to thereby recognize the target object based on the color image so obtained. In this case, although color information is generated by using four pixels as one unit in many cases, it has been difficult to recognize a target object with good precision because such a phenomenon as color bleeding or false colors occurs. On the other hand, a high-resolution color image of a target object, which is free from such a phenomenon as bleeding or false colors, can be obtained by generating a color image of the target object by combining three monochromatic images thereof which are obtained by a monochromatic camera by shining red (R), green (G), and blue (B) lights on the target object. However, since a color image of any target object is generated by combining three monochrome images thereof, there has been caused a problem in that the imaging time is unnecessarily long for a target object that can sufficiently be recognized only by a monochromatic image thereof.

A board work system disclosed in the present description has been made to solve the problem described above, and a main object thereof is to enable an appropriate selection as required between a use of a composite image of a high resolution and a use of a monochromatic image.

Solution to Problem

According to the present description, there is provided a board work system for working on a board disposed on an XY-plane, including:

a moving device configured to move over the XY-plane;
a lighting device attached to the moving device and configured to shine independently at least two monochromatic lights in monochromatic lights of R, G, B on a target object on the XY-plane;
a monochromatic camera attached to the moving device and configured to obtain monochromatic images of the target object which is illuminated by the lighting device; and
an image processing device configured to select one or multiple monochromatic lights from the at least two monochromatic lights based on the target object and in the case that the number of monochromatic lights selected is one, to cause the lighting device and the monochromatic camera to obtain a monochromatic image of the target object which is illuminated with the one monochromatic light and set the monochromatic image of the target object so obtained as a target object inspection image, or in the case that the number of monochromatic lights selected is a multiple number, to cause the lighting device and the monochromatic camera to obtain monochromatic images of the target object which is illuminated independently with the multiple monochromatic lights and set a composite image into which the individual monochromatic images are combined as the target object inspection image.

With this board work system, one or multiple monochromatic lights from the at least two monochromatic lights are selected based on the target object, and in the case that the number of monochromatic lights selected is one, the lighting device and the monochromatic camera are caused to obtain a monochromatic image of the target object which is illuminated with the one monochromatic light, and the monochromatic image of the target object so obtained is set as a target object inspection image. In the case that the number of monochromatic lights selected is a multiple number, the lighting device and the monochromatic camera are caused to obtain monochromatic images of the target object which is illuminated independently with the multiple monochromatic lights, and a composite image into which the individual monochromatic images are combined is set as the target object inspection image. Since color information is obtained for each pixel for the composite image, the composite image can constitute a high-resolution image which is free from such a phenomenon as color bleeding or false color, compared with a case in which color information is prepared based on a unit of four pixels which are arranged into a square configuration; however, since imaging needs to be executed multiple times, imaging takes some time. Here, whether one monochromatic image or the composite image is used as the target object inspection image is selected based on the target object. That is, whether one monochromatic image or the high-resolution composite image is used can be selectively determined for the target object as required. As a result, the processing time is shortened as compared with a case in which the composite image is used as the target object inspection image for all target objects involved.

Here, the target object inspection image may be used for automatic inspection of a target object by the image processing device, or the target object inspection image may be such as to be displayed on a display by the image processing device for the operator to inspect the target object.

DESCRIPTION OF EMBODIMENTS

Figure 1:
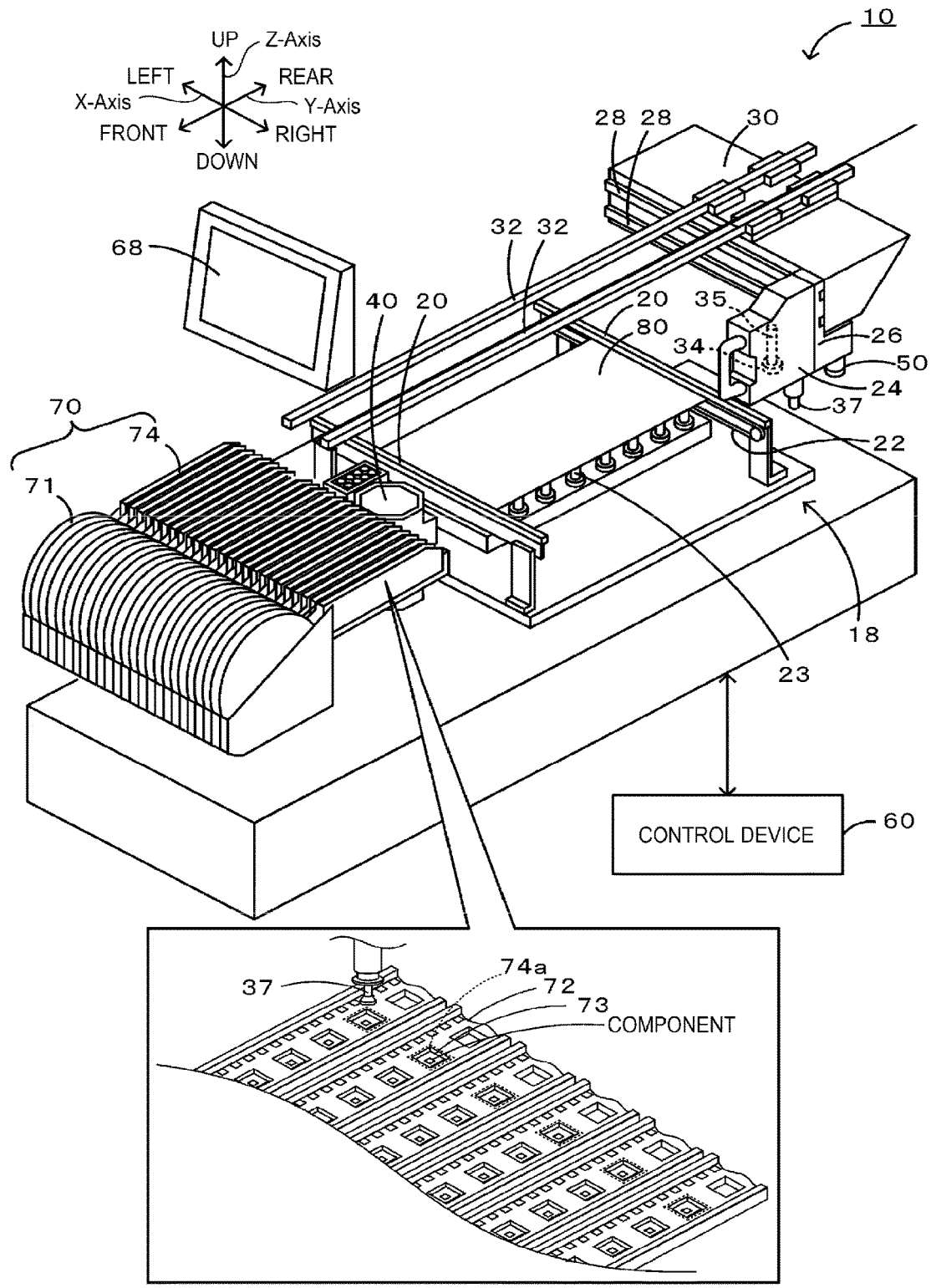
FIG. 1 is a perspective view of component mounter 10.
Figure 2:
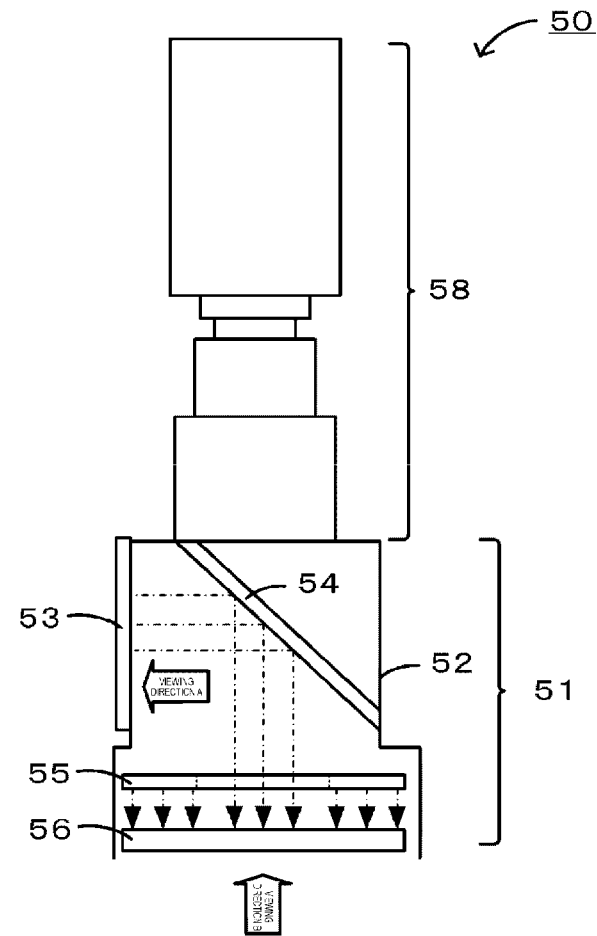
FIG. 2 is a schematic explanatory diagram showing the configuration of mark camera 50.
Figure 3:
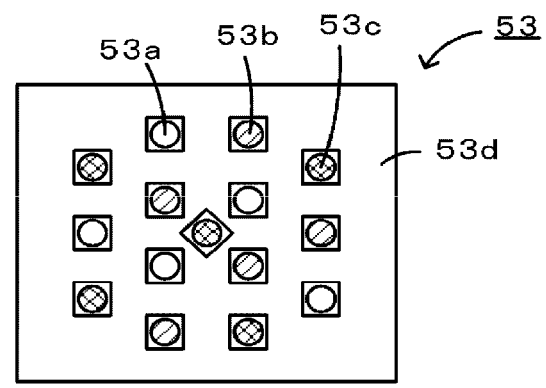
FIG. 3 is a view of vertical light source 53 as viewed in a direction indicated by an arrow A.
Figure 4:
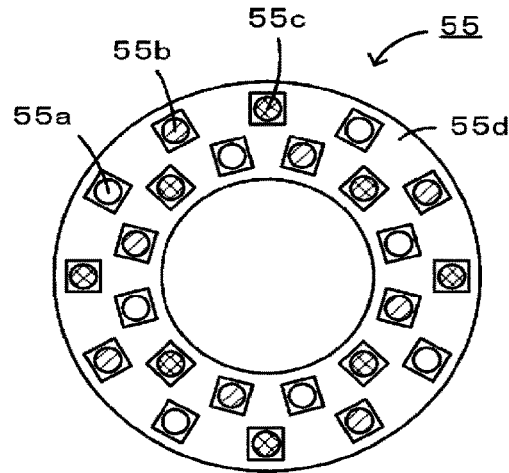
FIG. 4 is a view of side light source 55 as viewed in a direction indicated by an arrow B.
Figure 5:
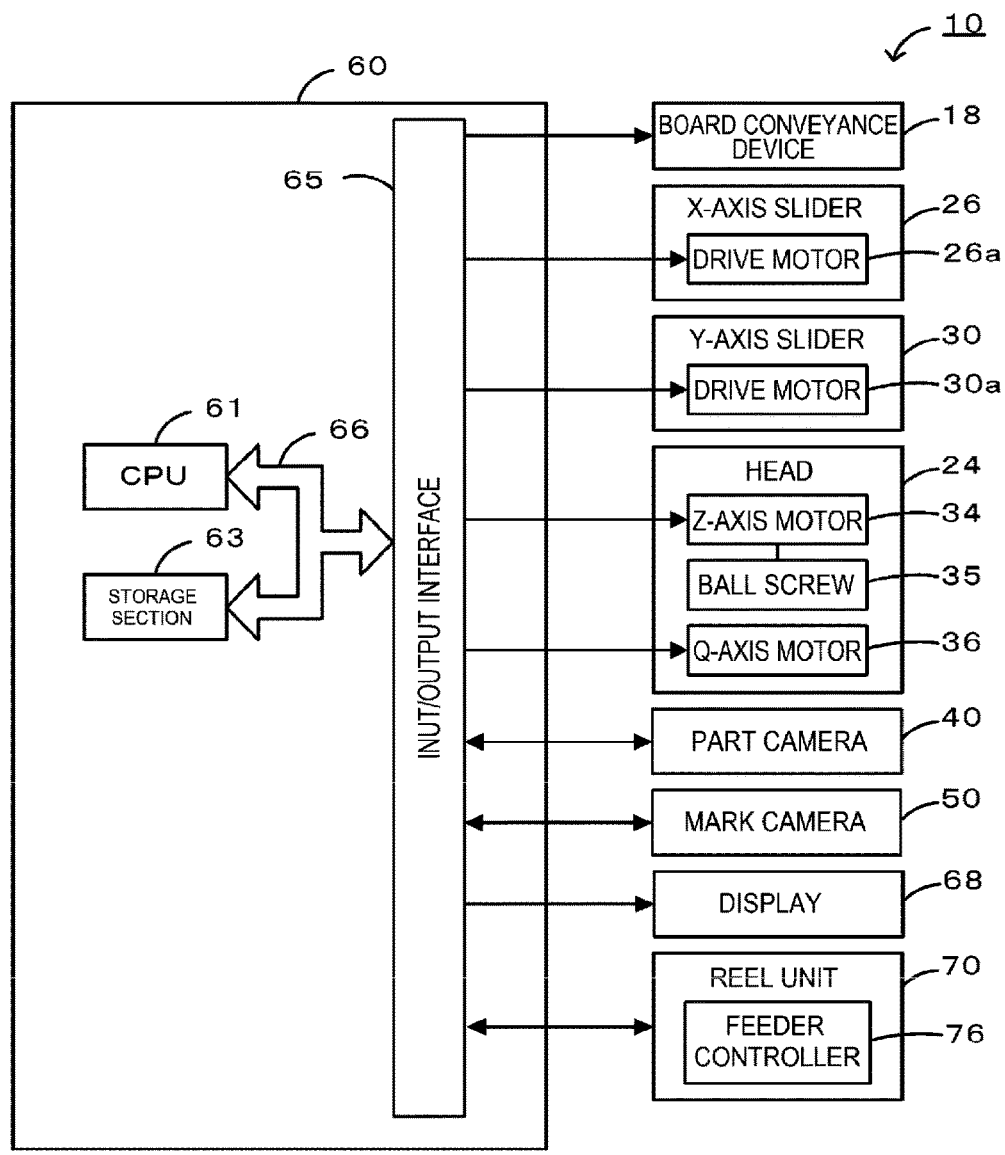
FIG. 5 is a block diagram showing a configuration associated with control of component mounter 10.

A preferred embodiment of a component mounter disclosed in the present description will be described below by reference to drawings. FIG. 1 is a perspective view of component mounter 10, FIG. 2 is a schematic explanatory view of mark camera 50, FIG. 3 is a view of vertical light source 53 as viewed in a direction indicated by an arrow A, FIG. 4 is a view of side light source 55 as viewed in a direction indicated by an arrow B, and FIG. 5 is a block diagram showing a configuration associated with control of component mounter 10. In the present embodiment, a left-right direction (X-axis), a front-rear direction (Y-axis), and an up-down direction (Z-axis) are as shown in FIG. 1.

Component mounter 10 includes board conveyance device 18, head 24, nozzle 37, part camera 40, mark camera 50, display 68, reel unit 70, and control device 60.

Board conveyance device 18 is a device for conveying and holding board 80. Board conveyance device 18 includes support plates 20, 20 and conveyor belts 22, 22 (shown only one of them in FIG. 1). Support plates 20, 20 are members extending in the left-right direction and are provided in such a manner as to be spaced apart from each other in the front-rear direction in FIG. 1. Conveyor belts 22, 22 are stretched individually between drive wheels and driven wheels which are provided at left and right end portions of support plates 20, 20 in such a manner as to be formed into endless loops. Board 80 is placed on upper surfaces of pair of conveyor belts 22, 22 and is then conveyed from the left to the right. This board 80 can be supported from a rear surface side thereof by multiple erected support pins 23. As a result, board conveyance device 18 also functions as a board supporting device.

Head 24 is attached to a front surface of X-axis slider 26. X-axis slider 26 is attached to a front surface of Y-axis slider 30. Y-axis slider 30 is slidably attached to pair of left and right guide rails 32, 32 which extend in the front-rear direction. Pair of upper and lower guide rails 28, 28, which extend in the left-right direction, are provided on the front surface of Y-axis slider 30. X-axis slider 26 is slidably attached to these guide rails 28, 28. Head 24 moves in the left-right direction as X-axis slider 26 moves in the left-right direction and moves in the front-rear direction as Y-axis slider 30 moves in the front-rear direction. Sliders 26, 30 are driven by drive motors 26a, 30a (refer to FIG. 5), respectively. In addition, head 24 incorporates Z-axis motor 34, so that the height of nozzle 37 attached to ball screw 35 extending along the Z axis is adjusted by Z-axis motor 34. Further, head 24 incorporates Q-axis motor 36 (refer to FIG. 5) for rotating nozzle 37 on its own axis.

Nozzle 37 is a member for picking up a component at a nozzle tip and holding the component thereto and releasing the component so picked up and so held from the nozzle tip. Nozzle 37 can be supplied with a pressure from a pressure supply source, not shown, and when, for example, a negative pressure is supplied to nozzle 37, nozzle 37 picks up a component, while when the supply of the negative pressure is stopped or a positive pressure is supplied thereto, nozzle 37 releases the component so picked up therefrom. Nozzle 37 protrudes downward from a bottom surface of a main body of head 24. In addition, the height of a component picked up by nozzle 37 is adjusted by nozzle 37 being lifted up or lowered along a Z-axis direction by Z-axis motor 34. An orientation of the component picked up by nozzle 37 is adjusted by rotating nozzle 37 by Q-axis motor 36.

Part camera 40 is disposed in front of board conveyance device 18. An imaging range of part camera 40 is a range lying above part camera 40, and part camera 40 images a component held by nozzle 37 from below to generate a captured image thereof.

Mark camera 50 is provided on a lower surface of X-axis slider 26. Mark camera 50 images a target object (an imaging target object) from above to generate a captured image thereof. Examples of target objects for mark camera 50 include a component held onto tape 72 which is fed out from feeder 74 in reel unit 70, a mark affixed to board 80, a component which has been mounted on board 80, and solder with which printing is executed on board 80.

As shown in FIG. 2, mark camera 50 includes lighting device 51 and camera main body 58. Lighting device 51 includes housing 52, vertical light source 53, half mirror 54, and side light source 55. Housing 52 is a cylindrical member opened in a lower surface thereof and is attached to a lower portion of camera main body 58. vertical light source 53 is provided on an inner side surface of housing 52. As shown in FIG. 3, vertical light sources 53 is such that red LEDs 53a for emitting monochromatic light of red (R), green LEDs 53b for emitting monochromatic light of green (G), and blue LEDs 53c for emitting monochromatic right of blue (B) are disposed equally or substantially equally in number on a quadrangular support plate. These LEDs 53a to 53c are each such that a hemispherical lens is attached to a quadrangular base where a light emitting element is disposed at a center thereof in such a manner as to cover the light emitting element. Half mirror 54 is provided inside housing 52 in such a manner as to be disposed obliquely. Half mirror 54 reflects horizontal light from LEDs 53a, 53b, 53c of vertical light source 53 downwards. Half mirror 54 transmits light from below towards camera main body 58. Side light source 55 is provided in the vicinity of a lower opening of housing 52 in such a manner as to be disposed horizontally. As shown in FIG. 4, side light source 55 is such that red LEDs 55a, green LEDs 55b, and blue LEDs 55c are disposed equally or substantially equally in number on an annular support plate 55d and emits light downwards. These LEDs 55a to 55c are each such that a hemispherical lens is attached to a quadrangular base where a light emitting element is disposed at a center thereof in such a manner as to cover the light emitting element. Diffuse plate 56 is provided below side light source 55 in housing 52. Lights emitted from vertical light source 53 and side light source 55 are finally diffused by diffuse plate 56 and is then shined onto a target object. Camera main body 58 generates a captured image based on lights received thereby. Camera main body 58 includes an optical system such as a lens, not shown, and an imaging element (for example, CCD). When lights emitted from vertical light source 53 and side light source 55 and reflected on a target object pass through half mirror 54 and reach camera main body 58, camera main body 58 receives the lights to generate a captured image.

Wavelength regions of R, G, and B lights are not limited particularly; however, R light may be defined to range from 590 to 780 nm, G light may be defined to range from 490 to 570 nm, and B light may be defined to range from 400 to 490 nm.

Display 68 is such as to display various types of images in color or monochrome.

Reel unit 70 is such that multiple feeders 74 are detachably mounted therein. Feeders 74 each include corresponding reel 71. Tape 72 is wound around reel 71. Multiple accommodation recessed sections 73 are provided in a front surface of tape 72 along a longitudinal direction of tape 72. Components are accommodated individually in accommodation recessed sections 73. These components are protected by a film covering the front surface of tape 72. Tape 72, which is configured as described above, is unwound from reel 71 toward the rear, and the film is peeled off in predetermined component supply position 74a of feeder 74, where the component is exposed. The component fed out to predetermined component supply position 74a is picked up by nozzle 37. The operation of reel unit 70 is controlled by feeder controller 76 (refer to FIG. 5) provided in each feeder 74.

As shown in FIG. 5, control device 60 includes CPU 61, storage section 63 (ROM, RAM, HDD, and the like), input/output interface 65, and the like, which are connected to each other via bus 66. Control device 60 outputs drive signals to board conveyance device 18, drive motor 26a of X-axis slider 26, drive motor 30a of Y-axis slider 30, Z-axis motor 34, Q-axis motor 36, part camera 40, mark camera 50, display 68, and the pressure supply source, not shown, for nozzle 37. Control device 60 receives a captured image inputted from part camera 40 and a captured image inputted from mark camera 50. Control device 60 is connected to feeder controllers 76 of reel unit 70 for communication. Although not shown, sliders 26 and 30 are each equipped with a position sensor, not shown, and control device 60 controls drive motors 26a, 30a of respective sliders 26, 30 while receiving positional information inputted thereinto from the individual positions sensors.

Figure 6:
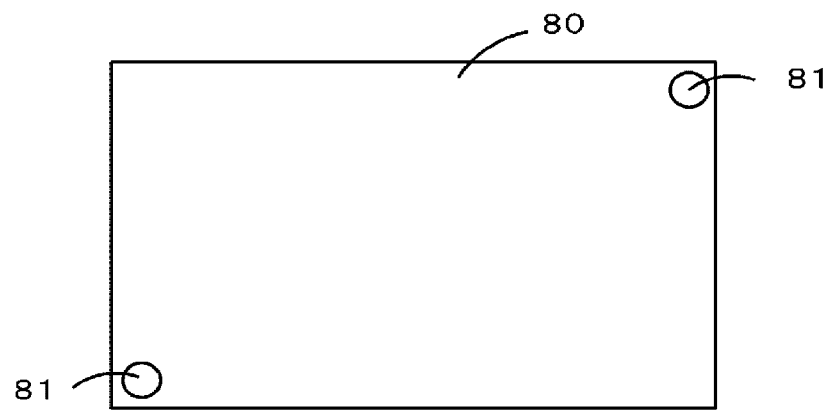
FIG. 6 is a plan view of board 80 having fiducial marks 81.
Figure 7:
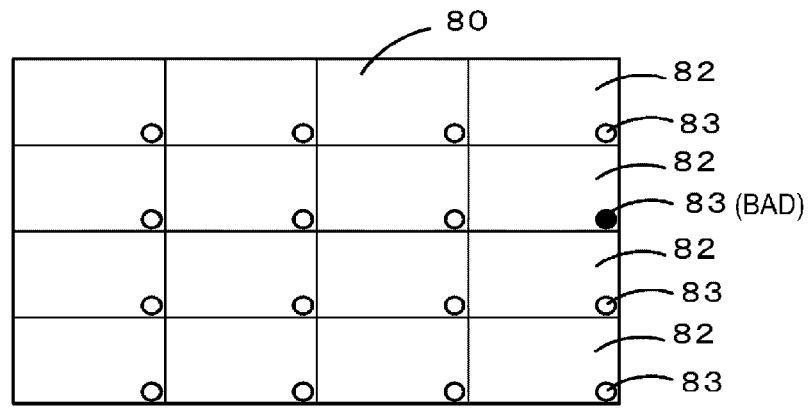
FIG. 7 is a plan view of board 80 having block skip marks 83.

Here, board 80 will be described. Board 80 shown in FIG. 6 has fiducial marks 81. Fiducial marks 81 are marks individually provided in two diagonal corners of board 80 and are used, for example, to correct the posture (position and inclination) of board 80. Here, it is assumed that fiducial marks 81 are prepared so as to be clearly distinguishable from board 80 by using a monochromatic image captured when fiducial marks 81 are illuminated with monochromatic light of R. In addition, board 80 shown in FIG. 7 has block skip marks 83. Block skip marks 83 are marks for indicating whether each board block 82 is a good block or a bad block in quality in the case that board 80 is formed so that multiple small boards (board blocks 82) are taken therefrom. As a result, block skip marks 83 are prepared so that a mark indicating a good block in quality (a white mark in FIG. 8) and a mark indicating a bad block in quality (a black mark in FIG. 8) can be distinguished from each other. Here, it is assumed that block skip marks 83 are prepared so as to be clearly distinguished from board 80 by use of monochromatic images captured when block skip marks 83 are illuminated with monochromatic light of R. That is, the monochromatic light of R is selected for both fiducial marks 81 and block skip marks 83 based on the distinctiveness between these marks 81, 83 and board 80 which constitutes a background therefor.

Next, an operation of component mounter 10 will be described which is performed thereby when component mounter 10 executes a component mounting process. CPU 61 of control device 60 controls the individual sections of component mounter 10 based on a production program received from a management device, not show, to produce board 80 on which multiple components of multiple types are mounted. Specifically speaking, CPU 61 causes X-axis slider 26 and Y-axis slider 30 to position nozzle 37 so as to face a component fed out to component supply position 74a by reel unit 70, which constitutes a component supply device. Subsequently, CPU 61 causes nozzle 37 to pick up the component in component supply position 74a by controlling the pressure of nozzle 37. Then, CPU 61 causes part camera 40 to capture an image of the component picked up by nozzle 37 and recognizes a posture of the component based on the image of the component so obtained. Subsequently, CPU 61 causes X-axis slider 26 and Y-axis slider 30 to dispose the component directly above a designated position on board 80 in consideration of the posture of the component picked up by nozzle 37 and then causes nozzle 37 to release the component by controlling the pressure of nozzle 37. CPU 61 repeatedly executes the series of operations of the component mounting process to mount a predetermined number of components of predetermined types on board 80. A mounting line is formed by aligning multiple component mounters 10 configured as described heretofore in the left-right direction. It is designed that when board 80 is conveyed from upstream-most component mounter 10 to downstream-most component mounter 10 along one mounting line, all the predetermined components are mounted on board 80.

Figure 8:
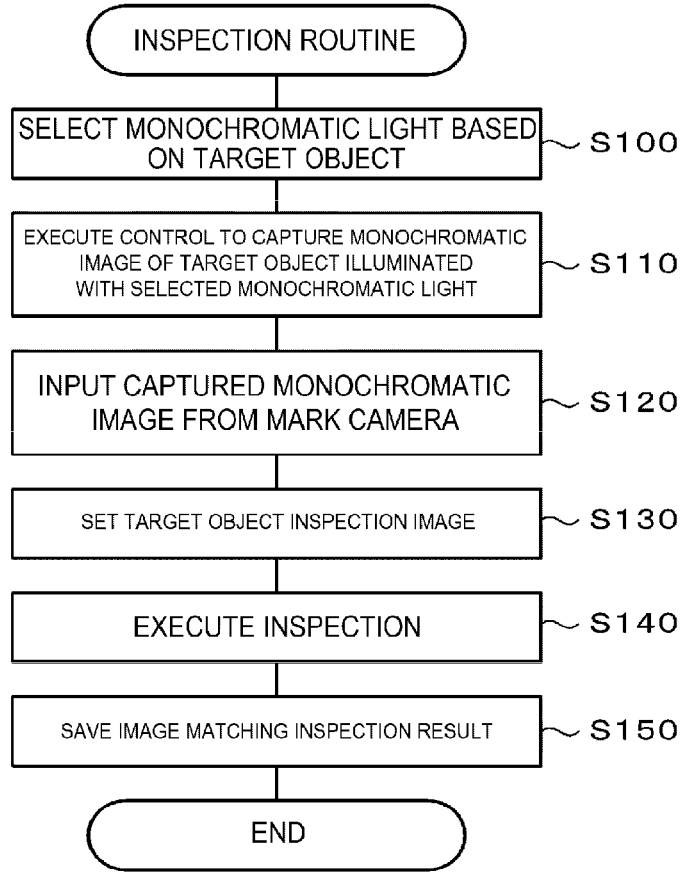
FIG. 8 is a flowchart showing an example of an inspection routine.
Figure 9:
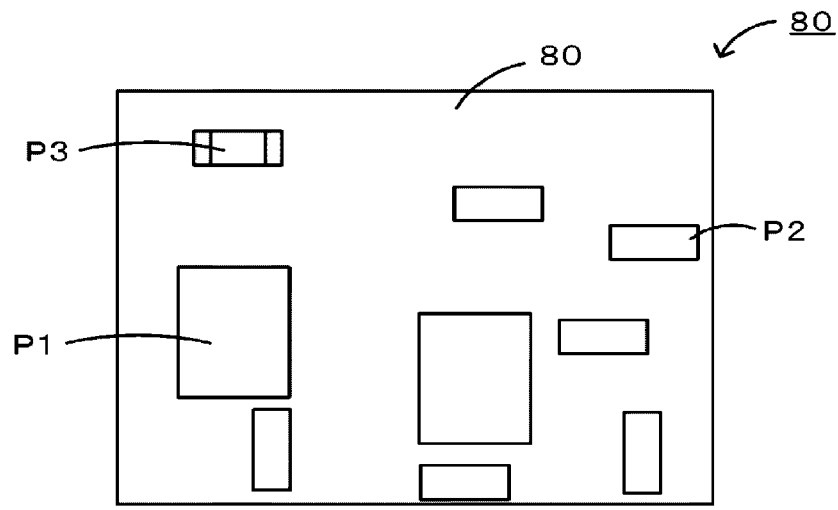
FIG. 9 is a plan view of board 80 on which components P1, P2, P3 have been mounted.

Next, an operation of component mounter 10 will be described which is performed thereby when component mounter 10 executes an inspection of a target object. FIG. 8 is a flowchart showing an example of an inspection routine. When starting an inspection routine, CPU 61 of control device 60 first selects monochromatic light based on a target object (S100). For example, in the case that a target object is fiducial mark 81 (refer to FIG. 6), CPU 61 selects the monochromatic light of R from the three monochromatic lights of R, G, B. Similarly, in the case that a target object is block skip mark 83 (refer to FIG. 7), CPU 61 selects the monochromatic light of R. As described above, this is because both fiducial mark 81 and block skip mark 83 can clearly be distinguished from board 80 (background) in a monochromatic image captured by shining the monochromatic light of R thereon. On the other hand, in the case that a target object is a component on board 80 shown in FIG. 9 on which the required component mounting has been completed (for example, board 80 on which all the components managed by component mounter 10 have been mounted completely), CPU 61 selects all the monochromatic lights in the three monochromatic lights of R, G, B. Three types of components P1, P2, P3 are mounted on board 80 in FIG. 9, and specifically speaking, two components P1, six components P2, and one component P3 are mounted on board 80. It is assumed that all components P1, P2, P3 cannot clearly be distinguished from board 80 (background) in monochromatic images of components P1, P2, P3 on board 80 which are captured by shining any monochromatic light in the monochromatic lights of R, G, B on components P1, P2, P3, but all components P1, P2, P3 can clearly be distinguished from board 80 in a composite image (a color image) into which the monochromatic images produced by the monochromatic lights of R, G, B are combined. That is, all the monochromatic lights of R, G, B are selected based on the distinctiveness between components P1, P2, P3 and board 80, which constitutes the background for components P1, P2, P3.

Next, CPU 61 causes mark camera 50 (that is, lighting device 51 and camera main body 58) to capture a monochromatic image of a target object which is illuminated with the selected monochromatic light (S110) and causes the monochromatic image so captured to be inputted thereinto from mark camera 50 (S120). For example, as in the case that a target object is fiducial mark 81 or block skip mark 83, if a selected monochromatic light is the monochromatic light of R, CPU 61 causes mark camera 50 to capture a monochromatic image of the target object which is illuminated with the monochromatic light of R and then causes mark camera 50 to input the monochromatic image so captured into CPU 61 therefrom. On the other hand, as in the case that target objects are components P1, P2, P3 on board 80 shown in FIG. 9 on which all the required components have been mounted completely, if selected monochromatic lights are all the monochromatic lights in the three monochromatic lights of R, G, B, CPU 61 causes mark camera 50 to sequentially capture monochromatic images of components P1, P2, P3 which are illuminated with the monochromatic light of R, monochromatic images of P1, P2, P3 which are illuminated with the monochromatic light of G, and monochromatic images of components P1, P2, P3 which are illuminated with the monochromatic light of B and causes mark camera 50 to input the monochromatic images so captured into CPU 61 therefrom. In illuminating a target object with monochromatic light, although side light source 55 of lighting device 51 is normally used, in the case that a target object has a glossy surface like a metallic surface, vertical light source 53 is used.

Next, CPU 61 sets a target object inspection image (S130). For example, as in the case that a target object is fiducial mark 81 or block skip mark 83, if CPU 61 causes mark camera 50 to input a monochromatic image of the target object which is illuminated with the monochromatic light of R into CPU 61 therefrom, CPU 61 sets the monochromatic image so inputted as a target object inspection image. On the other hand, as in the case that target objects are components P1, P2, P3 on board 80 shown in FIG. 9 on which all the required components have been mounted completely, if CPU 61 causes mark camera 50 to input monochromatic images of the target object which is illuminated independently with the monochromatic lights of R, G, B into CPU 61 therefrom, CPU 61 generates a composite image (a color image) by combining the individual monochromatic images together and sets the composite image so generated as a target object inspection image.

Here, a color image generated in the present embodiment will be described. Information representing a brightness in R for each pixel in a multistage gradation (for example, 256 gradations) is obtained from a black-and-white or monochromatic image of a target object which is illuminated with the monochromatic light of R. Information representing a brightness in G for each pixel in a multistage gradation is obtained from a black-and-white or monochromatic image of a target object which is illuminated with the monochromatic light of G. Information representing a brightness in B for each pixel in a multistage gradation is obtained from a black-and-white or monochromatic image of a target object which is illuminated with the monochromatic light of B. Since information on R, G, B for each pixel can be obtained from these pieces of information, a color image can be generated. Since the information on R, G, B can be obtained for each pixel for the color image generated as described above, a high-resolution color image, which is free from such a phenomenon as color bleeding or false colors, can be obtained, when compared with a case in which color information is generated using four pixels, which are arranged into a square configuration, as one unit (for example, a square configuration of four pixels as one unit in which R and B are aligned along a first diagonal line and G and G are aligned along a second diagonal line).

Next, CPU 61 executes an inspection on the target object using the target object inspection image (S140). For example, as in the case that a target object is fiducial mark 81 or block skip mark 83, if the monochromatic image of the target object which is obtained by illuminating the target object with the monochromatic light of R is set as the target object inspection image, fiducial mark 81 or block skip mark 83 is inspected for its position by use of the monochromatic image. Fiducial marks 81 or block skip marks 83 are inspected for their positions before components are started to be mounted on board 80. Since the posture of board 80 can be identified from its position which can be obtained by inspecting fiducial mark 81 for its position, subsequent component mounting can be executed with good precision in consideration of the posture so identified. Component mounting can be executed by skipping a bad board block 82 in quality by inspecting block skip marks 83 for their positions. If the positions of fiducial marks 81 or block skip marks 83 cannot be recognized or if the positions of fiducial marks 81 or block skip marks 83 are offset from their original positions beyond a permissible range, an error is determined to be occurring in board 80, whereby that particular board 80 is discharged without any component being mounted thereon. On the other hand, as in the case that target objects are components P1, P2, P3 on board 80 shown in FIG. 9 on which all the required components have been mounted completely, if a color image is set as a target object inspection image, board 80 is inspected for positions of components P1, P2, P3 using the color image. As described above, since the color image obtained in the present embodiment is the high-resolution color image which is free from such a phenomena as color bleeding or false colors, the positions of components P1, P2, P3 can be recognized accurately, as a result of which the precision of the inspection is improved. On the other hand, if the positions of components P1, P2, P3 cannot be recognized or if the positions of components P1, P2 P3 are offset from their original positions beyond a permissible range, an error is determined to be occurring in board 80, whereby that particular board 80 is disposed as a bad board in quality.

Next, CPU 61 saves the image corresponding to the inspection result in storage section 63 (S 150) and ends the present routine. For example, in the case that a target object is fiducial mark 81 or block skip mark 83, if no error occurs or is determined to occur, CPU 61 saves a monochromatic image of the target object which is illuminated with the monochromatic light of R in storage section 63. At this time, the monochromatic image may be compressed for saving. This is because the image resulting when no error occurs does not have to be studied in detail. On the other hand, in the case that a target object is fiducial mark 81 or block skip mark 83, if an error occurs or is determined to occur, CPU 61 causes mark camera 50 to capture monochromatic images of the target object which is independently illuminated with the other monochromatic lights (that is, the monochromatic lights of G and B) and saves the resulting monochromatic images of R, G, B in storage section 63. This enables a cause for the error to be traced back later by studying the monochromatic images of R, G, B so saved. At this time, in place of or in addition to saving individually the monochromatic images of R, G, B in storage section 63, a color image which can be obtained by combining the monochromatic images of R, G, B together may be saved in storage section 63. On the other hand, in the case that target objects are components P1, P2, P3 on board 80 shown in FIG. 9 on which all the required components have been mounted completely, if no error occurs or is determined to occur, CPU 61 saves the color image in storage section 63. At this time, the color image may be compressed for saving. This is because the image resulting when no error occurs does not have to be studied in detail. On the other hand, in the case that target objects are components P1, P2, P3 on board 80 (refer to FIG. 9) on which all the required components have been mounted completely, if an error occurs or is determined to occur, CPU 61 saves the color image in storage section 63 without compressing it. This enables a cause for the error to be traced back later by studying the color image. At this time, in place of or in addition to saving the color image in storage section 63, CPU 61 may save the monochromatic images of R, G, B in storage section 63.

Here, the correspondence between the constituent elements of the present embodiment and the constituent elements of the board work system disclosed in the present description will be described. Component mounter 10 of the present embodiment corresponds to the board work system disclosed in the present description, X-axis slider 26 and Y-axis slider 30 correspond to the moving device, lighting device 51 corresponds to the lighting device, camera main body 58 corresponds to the monochromatic camera, and control device 60 corresponds to the image processing device. In addition, display 68 corresponds to an image display device, and storage section 63 corresponds to a storage device.

In the present embodiment that has been described heretofore, whether one monochromatic image or the composite image is used as the target object inspection image is selectively determined based on the target object. That is, whether one monochromatic image or the high-resolution composite image is used can be selectively determined for the target object as required. As a result, the processing time is shortened as compared with a case in which the composite image is used as the target object inspection image for all target objects involved.

In addition, whether one monochromatic light or all the monochromatic lights are selected from the three monochromatic lights of R, G, B is determined based on the distinctiveness of the target object from the background of the target object. As a result, an appropriate image is selected for inspection of the target object.

Further, CPU 61 determines whether the target object is good or bad in quality based on the result of the image recognition of the target object in the target object inspection image, and if CPU 61 determines that the target object is bad in quality, CPU 61 saves all the monochromatic images of the target object which is illuminated with the three monochromatic lights of R, G, B and/or the composite image into which all the monochromatic images are combined in storage section 63. As a result, a cause for the bad quality of the target object, which is determined as bad in quality, can be traced back later by reading out all the monochromatic images and/or the composite image (the color image) of the target object from storage section 63. At this time, if all the monochromatic images of the target object which is illuminated with the three monochromatic lights of R, G, B are not available, CPU 61 causes a monochromatic image corresponding to the unavailable one to be obtained and saves the monochromatic image so obtained as required.

The present disclosure is not limited in any way to the embodiment that has been described heretofore, and hence, needless to say, the present disclosure can be carried out in various aspects without departing from the technical scope of the present disclosure.

Figure 10:
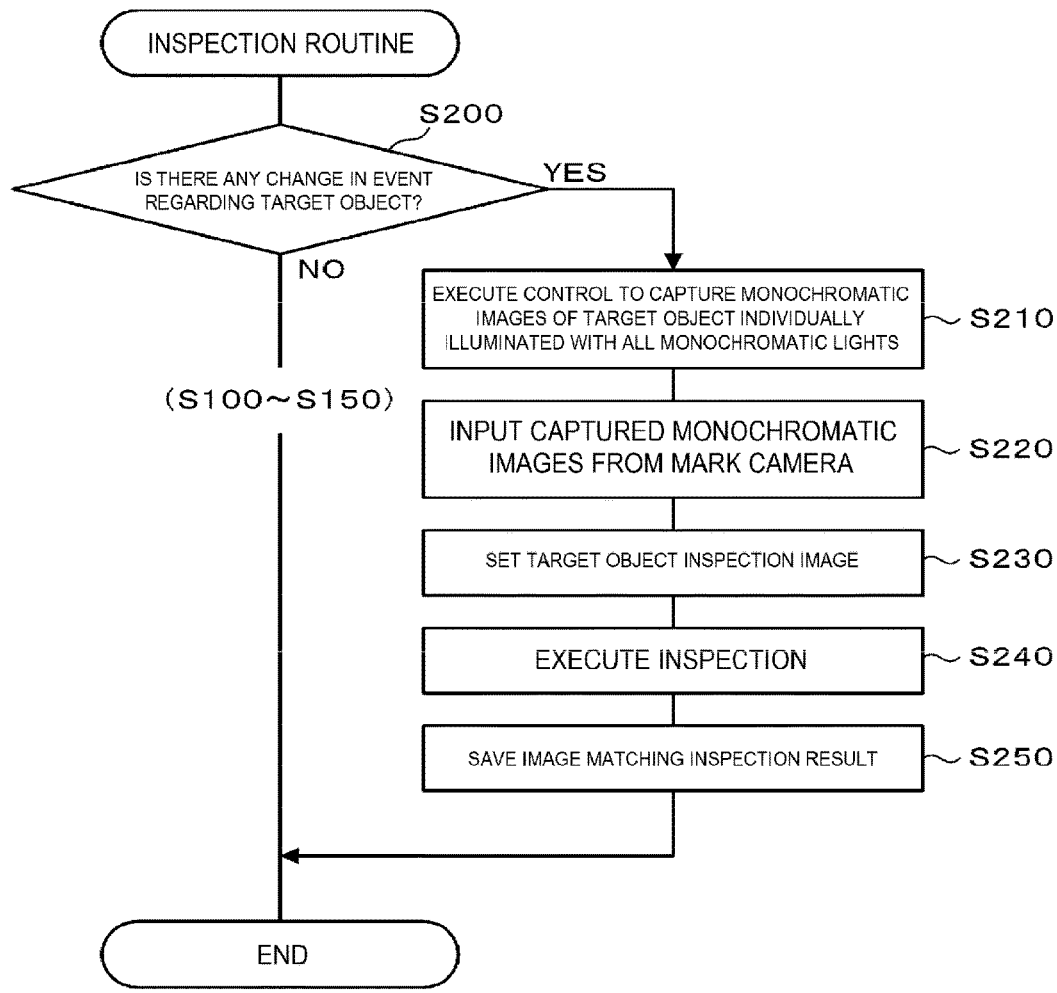
FIG. 10 is a flowchart showing an example of another inspection routine.

For example, in place of the inspection routine described in the embodiment described above, an inspection routine shown in FIG. 10 may be executed. In the inspection routine shown in FIG. 10, firstly, CPU 61 of control device 60 determines whether there has been a change in event regarding the target object (S200). Examples of changes in event regarding the target object include a change in the shape data of a component constituting the target object, an exchange of feeder 74 that supplies the component, an exchange of nozzle 37 that picks up the component, a change in the production company or production lot of the component, and the like. If CPU 61 determines in S200 that there is no change in event regarding the target object, CPU 61 executes the processing operations in S100 to S150 described above and ends the present routine. On the other hand, if CPU 61 determines in S200 that there has been a change in event regarding the target object, CPU 61 causes mark camera 50 to capture monochromatic images of the target object which is illuminated with all the monochromatic lights of R, G, B irrespective of what the target object is (S210) and then causes mark camera 50 to input the monochromatic images so captured into CPU 61 therefrom (S220). Next, CPU 61 sets a target object inspection image (S230). Here, CPU 61 generates a composite image (a color image) of the target object by combining the monochromatic images of the target object which is illuminated independently and individually with the monochromatic lights of R, G, B, which are inputted thereinto from mark camera 50, and sets the composite image so generated as a target object inspection image. Thereafter, CPU 61 executes processing operations in S240 and S250, which are similar to those in S140 and S150 described above, and ends the present routine. In S250, if CPU 61 determines that the result of the inspection is not an error, CPU 61 compresses the composite image to save it in storage section 63, while if CPU 61 determines that the result of the inspection is an error, CPU 61 saves the composite image in storage section 63 without compressing the composite image. As a result, since there is a high probability that an error occurs when there occurs a change in event regarding the target object, how the target object is influenced by the change in event can be traced back in detail later by reading out the composite image (the color image) of the target object from storage section 63. If the result of the inspection becomes an error, CPU 61 may save the individual monochromatic images of the target object which are produced by the monochromatic lights of R, G, B in storage section 63 in place of or in addition to saving the composite image in storage section 63. In this way, too, how the target object is influenced by the change in event can be traced back in detail later by reading out all the monochromatic images and/or the composite image (the color image) of the target object from storage section 63.

In the embodiment described above, the monochromatic light is selected based on a target object, and a monochromatic image of the target object which is illuminated with the monochromatic light so selected is captured; however, in the case that an onboard editing image is prepared which is used to execute such editing on display 68 of component mounter 10, a configuration may be adopted, irrespective of what a target object is, in which monochromatic images of the three colors of R, G, B are captured and are then combined together to prepare a composite image (a color image) of the target object for display on display 68.

In the embodiment described above, a configuration may be adopted in which monochromatic images of a target object which is illuminated independently and individually with the monochromatic lights of R, G, B are captured when production is started, and in the case that a feature point of the target object can be identified well from a background of the target object in any of the captured monochromatic images of R, G, B, the monochromatic light constituting that particular monochromatic image is associated with the target object, while in the case that the feature point of the target object cannot be identified well in any of the captured monochromatic images of R, G, B, all the monochromatic lights are associated with the target object so as to obtain a composite image (a color image) into which the individual monochromatic images are combined. This association work may be executed by CPU 61 of control device 60 or may be executed by the operator. In addition, a configuration may be adopted in which all the monochromatic lights are selected irrespective of what a target object is in the inspection routine in S100 until a predetermined period of time elapses after the production is started, whereafter that association work is executed. After the association work has been executed, the monochromatic light associated with the target object only needs to be selected in the inspection routine in S100.

In the inspection routine of the embodiment described above, even in the case of a target object for which one certain monochromatic light is selected, a configuration may be adopted in which monochromatic images of the target object which is illuminated independently with the monochromatic lights of R, G, B are combined together into a composite image (a color image) for saving.

In the embodiment described above, a target object may be a component accommodated in accommodation recessed section 73 in tape 72 of reel unit 70. In addition, reel unit 70 is exemplified as the component supply device of component mounter 10; however, the present disclosure is not particularly limited to this, and hence, for example, a tray unit in which a component is placed on a tray for supply may be adopted. In this case, a target object may be a component placed on the tray.

In the embodiment described above, although lighting device 51 is described as being able to shine independently lights of the three colors of R, G, B, lighting device 51 may be such as to shine independently lights of two colors (for example, R and G, R and B, or G and B). In this case, as for a target object that cannot be identified or recognized by a monochromatic image of one color, a composite image may be used into which monochromatic images of the target object which is illuminated independently with such two monochromatic lights are combined.

In the embodiment described above, component mounter 10 is exemplified as the board work system; however, the present disclosure is not limited to this, and hence, the board work system may be, for example, a solder printing machine disposed upstream of a mounting line in which multiple component mounters 10 are aligned. The solder printing machine is a device for executing printing with solder in a predetermined position on board 80 on which no component has been mounted, and the inspection routine described above may be executed for solder as a target object.

In S130 in the inspection routine in the embodiment described above, a configuration may be adopted in which CPU 61 sets a target object inspection image and thereafter displays the target object inspection image on display 68. This enables the operator to inspect the target object by watching the target object inspection image displayed on display 68. In this case, the processing operations in S140 and S150 may be omitted.

In the embodiment described above, although head 24 including one nozzle 37 is used, a rotary head may be used which includes multiple nozzles arranged at equal intervals along an outer circumference of a cylindrical head main body.

In the embodiment described above, nozzle 37 is exemplified as the member for picking up and holding a component; however, the present disclosure is not particularly limited to this, and hence, for example, a mechanical chuck or an electromagnet may be provided in place of nozzle 37.

The board work system disclosed in the present description may be configured as follows.

In the board work system disclosed in the present description, the image processing device may display the target object inspection image on the image display device. This enables the operator to confirm the target object inspection image by looking at the image display device.

In the board work system disclosed in the present description, the image processing device may select one or multiple monochromatic lights from the at least two monochromatic lights based on the distinctiveness of the target object from the background of the target object. This enables an appropriate image to be selected for inspection of the target object. For example, in the case that the target object can be identified from the background of the target object in a monochromatic image of the target object which is illuminated with one certain monochromatic light of multiple monochromatic lights, the image processing device only needs to select the one certain monochromatic light, while in the case that the target object cannot be identified from the background of the target object in monochromatic images of the target object which is illuminated individually with both of the multiple monochromatic lights but can be identified in a composite image, the image processing device only needs to select the multiple monochromatic lights corresponding to the monochromatic images required to make up the composite image.

In the board work system disclosed in the present description, the lighting device can shine independently the three monochromatic lights of R, G, B on the target object, and the image processing device may set one monochromatic light in the three monochromatic lights of R, G, B or may select all the monochromatic lights based on the target object. This enables the composite image to be a color image which is obtained by combining the individual monochromatic images of R, G, B together.

In the board work system disclosed in the present description, the image processing device may adopt a configuration in which the image processing device determines whether the target object is good or bad in quality based on the result of the image recognition of the target object in the target object inspection image, and in the case that the image processing device determines that the target object is bad in quality, the image processing device saves all the monochromatic images produced by the three monochromatic lights of R, G, B, respectively, and/or the composite image into which all the monochromatic lights are combined in the storage device. This enables a cause for being bad in quality to be traced back later for the target object which is determined bad in quality by reading out all the monochromatic images and/or the composite image (the color image) of the target object from the storage device. For this, in the case that all the monochromatic images of the target object in the wavelengths of R, G, B are not available, the image processing device may cause the corresponding monochromatic camera to capture a monochromatic image corresponding to the unavailable monochromatic image. Alternatively, In the board work system disclosed in the present description, in the case that there is a change in event regarding the target object, the image processing device may save all the monochromatic images of the target object which is illuminated with the three monochromatic lights of R, G, B and/or the composite image into which all the monochromatic images are combined in the storage device. In the case that there is a change in event regarding the target object, this enables the influence on the target object by the change in event to be traced back later by reading out all the monochromatic images and/or the composite image (the color image) of the target object from the storage device. For this, in the case that all the monochromatic images of the target object in the wavelengths of R, G, B are not available, the image processing device may cause the corresponding monochromatic camera to capture a monochromatic image corresponding to the unavailable monochromatic image. Examples of the change in event regarding the target object include, when the target object is a component to be mounted on a board, a case in which the shape data of a component is changed, a case in which the component supply device for supplying the component or the nozzle is exchanged, a case in which the production company or the production lot of the component is exchanged, and the like.

In the board work system disclosed in the present description, the target object may be a mark affixed to the board, a component mounted on the board, a component disposed in the component supply device for supplying a component to the board, or solder with which printing is executed on the board.

INDUSTRIAL APPLICABILITY

The present disclosure can be applied to an industry involving work of mounting a component on a board.

REFERENCE SIGNS LIST

10 component mounter, 18 board conveyance device, 20 support plate, 22 conveyor belt, 23 support pin, 24 head, 26 X-axis slider, 26a drive motor, 28 guide rail, 30 Y-axis slider, 30a drive motor, 32 guide rail, 34 Z-axis motor, 35 ball screw, 36 Q-axis motor, 37 nozzle, 40 part camera, 50 mark camera, 51 lighting device, 52 housing, 53 vertical light source, 53a red LED, 53b green LED, 53c blue LED, 53d support plate, 54 half mirror, 55 side light source, 55a red LED, 55b green LED, 55c blue LED, 55d support plate, 56 diffuse plate, 58 camera main body, 60 control device, 61 CPU, 63 storage section, 65 input/output interface, 66 bus, 68 display, 70 reel unit, 71 reel, 72 tape, 73 accommodation recessed section, 74 feeder, 74a component supply position, 76 feeder controller, 80 board, 81 fiducial mark, 82 board block, 83 block skip mark, P1, P2, P3 component

The invention claimed is:

1. A board work system for working on a board disposed on an XY-plane, comprising:
a moving device configured to move over the XY-plane;
a lighting device attached to the moving device and configured to shine independently at least two monochromatic lights in monochromatic lights of R, G, B on a target object on the XY-plane;
a monochromatic camera attached to the moving device and configured to obtain monochromatic images of the target object which is illuminated by the lighting device; and
an image processing device configured to select one or multiple monochromatic lights from the at least two monochromatic lights based on the target object and in the case that the number of monochromatic lights selected is one, to cause the lighting device and the monochromatic camera to obtain a monochromatic image of the target object which is illuminated with the one monochromatic light and set the monochromatic image of the target object so obtained as a target object inspection image, or in the case that the number of monochromatic lights selected is a multiple number, to cause the lighting device and the monochromatic camera to obtain monochromatic images of the target object which is illuminated independently with the multiple monochromatic lights and set a composite image into which the individual monochromatic images are combined as the target object inspection image.

2. The board work system according to claim 1, wherein the image processing device displays the target object inspection image on an image display device.

3. The board work system according to claim 1, wherein the image processing device selects one or multiple monochromatic lights from the at least two monochromatic lights based on distinctiveness of the target object from a background of the target object.

4. The board work system according to claim 1, wherein the lighting device can shine independently three monochromatic lights of R, G, B on the target object, and
wherein the image processing device sets one monochromatic light in the three monochromatic lights of R, G, B or selects all the monochromatic lights based on the target object.

5. The board work system according to claim 4, wherein the image processing device determines whether the target object is good or bad in quality based on a result of an image recognition of the target object in the target object inspection image and saves all monochromatic images produced by three monochromatic lights of R, G, B and/or a composite image of the target object into which all the monochromatic images are combined in a storage device in the case that the image processing device determines that the target object is bad in quality.

6. The board work system according to claim 4, wherein the image processing device saves all monochromatic images produced by three monochromatic lights of R, G, B and/or a composite image of the target object into which all the monochromatic images are combined in a storage device in the case that an event regarding the target object changes.

7. The board work system according to claim 1, wherein the target object is a mark affixed to the board, a component mounted on the board, a component disposed in a component supply device configured to supply a component to the board, or solder with which printing is executed on the board.

* * * * *